United States Patent
Greiciunas

(10) Patent No.: US 12,405,069 B2
(45) Date of Patent: Sep. 2, 2025

(54) COOLING SYSTEM

(71) Applicant: BAE Systems plc, London (GB)

(72) Inventor: Evaldas Greiciunas, Preston (GB)

(73) Assignee: BAE Systems plc, London (GB)

( * ) Notice: Subject to any disclaimer, the term of this patent is extended or adjusted under 35 U.S.C. 154(b) by 113 days.

(21) Appl. No.: 18/577,932

(22) PCT Filed: Jul. 7, 2022

(86) PCT No.: PCT/GB2022/051750
§ 371 (c)(1),
(2) Date: Jan. 9, 2024

(87) PCT Pub. No.: WO2023/285784
PCT Pub. Date: Jan. 19, 2023

(65) Prior Publication Data
US 2024/0377144 A1    Nov. 14, 2024

(30) Foreign Application Priority Data

Jul. 16, 2021    (EP) ..................................... 21275095
Jul. 16, 2021    (GB) ..................................... 2110279

(51) Int. Cl.
*F28D 20/02* (2006.01)
*F28F 27/02* (2006.01)
(Continued)

(52) U.S. Cl.
CPC ............ *F28D 20/028* (2013.01); *F28F 27/02* (2013.01); *F28D 2020/0078* (2013.01); *F28D 2021/0029* (2013.01)

(58) Field of Classification Search
CPC .......... F28D 20/028; F28D 2020/0078; F28D 2021/0028; F28D 2021/0029; F28F 27/00;
(Continued)

(56) References Cited

U.S. PATENT DOCUMENTS 9,019,704 B2    4/2015  Rubenstein
9,043,035 B2 *  5/2015  Chainer ................ G06F 1/3206
                                                    700/282
(Continued)

FOREIGN PATENT DOCUMENTS

CN    101457964 A    6/2009
EP    3578903 A1    12/2019
(Continued)

OTHER PUBLICATIONS

European Search Report for Application No. EP 21275095 mail date Dec. 14, 2021, 1 page.
(Continued)

*Primary Examiner* — Joseph F Trpisovsky
(74) *Attorney, Agent, or Firm* — Maine Cernota & Curran

(57) ABSTRACT

A cooling system (100) for removing heat from a heat source (1000) fluid cooling circuit (1100). The cooling system (100) comprises a first fluid manifold (200) for flow of a heat transfer fluid, the first fluid manifold (200) comprising a flow inlet (210) and a flow outlet (212); a heat exchanger (310) and a heat sink unit (410) each in heat transfer communication with the first fluid manifold (200). In a first mode of operation, heat transfer fluid enters the flow inlet (210) and part of the heat transfer fluid flow is controlled to be in heat transfer communication with the heat exchanger (310), and the remainder of the heat transfer fluid flow is controlled to be in heat transfer communication with the heat sink unit (410). In a second mode of operation, heat transfer fluid enters the flow inlet (210) and all of the heat transfer fluid flow is controlled to first be in heat transfer communication with the heat sink unit (410) and then in heat transfer communication with the heat exchanger (310).

15 Claims, 3 Drawing Sheets

(51) Int. Cl.
*F28D 20/00* (2006.01)
*F28D 21/00* (2006.01)

(58) Field of Classification Search
CPC .... F28F 27/02; F25B 6/02; F25B 6/04; F25B 25/005
See application file for complete search history.

(56) References Cited

U.S. PATENT DOCUMENTS

| | | |
|---|---|---|
| 2004/0000155 A1 | 1/2004 | Cline |
| 2013/0074531 A1 | 3/2013 | Parsonnet |
| 2013/0138252 A1 | 5/2013 | Chainer |
| 2016/0118317 A1 | 4/2016 | Shedd |
| 2020/0326114 A1 | 10/2020 | Donovan |
| 2021/0068303 A1 | 3/2021 | Franz |

FOREIGN PATENT DOCUMENTS

| | | |
|---|---|---|
| WO | 2018200868 A1 | 11/2018 |
| WO | 2021019676 A1 | 2/2021 |

OTHER PUBLICATIONS

GB Search Report for Application No. GB2110279.3 mail date Apr. 22, 2022, 3 pages.
International Search Report and Written Opinion for International Application No. PCT/GB2022051750 mail date Jul. 7, 2022, 12 pages.

\* cited by examiner

COOLING SYSTEM

This application is a National Phase of PCT Application No. PCT/GB2022/051750 filed on Jul. 7, 2022, which claims priority to GB Application No. 2110279.3 filed on Jul. 16, 2021 and EP Application Serial No. 21275095.4 filed on Jul. 16, 20221. These applications are herein incorporated by reference in their entirety.

FIELD

The present disclosure relates to a cooling system.

In particular the disclosure is concerned with a cooling system for removing heat from a heat source.

BACKGROUND

It is a common requirement to manage heat generated by equipment during use, and there are many types of cooling systems which provide this function.

Many cooling systems rely on an expectation that heat generation will vary either slowly, remain relatively constant, or will be unlikely to peak to a dangerous level for more than a few moments before the cooling system can adjust and before damage occurs.

However, in some applications, the heat load may be characterised by a very rapid increase in heat generation causing temperatures to rise to very high levels for prolonged periods. Conventionally this either requires the system to be heat tolerant (for example made of materials which can cope with the high temperatures), to avoid performance at such levels or to time limit use of the equipment.

Phase change material (PCM) heat exchangers are a known heat sink solution but are limited in that they are only effective as a heat sink until the material used approaches the temperature of the heat source. This may be mitigated to some extent by providing a very large phase change material heat exchanger, although it can still operate only for a finite period before needing time to regenerate.

Increasing demands on some types of specialised equipment, for example specialised electrical and electronic equipment, results in the generation of vast amounts of heat energy which must be removed to prevent damage. Additionally the need for portable and/or compact versions of such equipment inherently limits the amount of phase change material which can be included in the system. Hence conventional cooling systems for such specialised equipment provide a performance limitation on the equipment, which is at least a significant inconvenience to the user, and provides a limitation on the application of such equipment.

Hence a cooling system which is able to provide cooling over a wide range of heat loads, can deal with sudden spikes in heat loads, while still enabling a compact and portable configuration, is highly desirable.

SUMMARY

According to the present disclosure there is provided an apparatus and system as set forth in the appended claims. Other features of the invention will be apparent from the dependent claims, and the description which follows.

Accordingly there may be provided a cooling system (100) for removing heat from a heat source (1000) fluid cooling circuit (1100). The cooling system (100) may comprise a first fluid manifold (200) for flow of a heat transfer fluid, the first fluid manifold (200) comprising a flow inlet (210) and a flow outlet (212). There may also be provided a heat exchanger (310) and a heat sink unit (410) each in heat transfer communication with the first fluid manifold (200). In a first mode of operation, heat transfer fluid enters the flow inlet (210) and part of the heat transfer fluid flow may be controlled to be in heat transfer communication with the heat exchanger (310). The remainder of the heat transfer fluid flow may be controlled to be in heat transfer communication with the heat sink unit (410). The flows may be combined before passing through the flow outlet (212). In a second mode of operation, heat transfer fluid enters the flow inlet (210) and all of the heat transfer fluid flow may be controlled to first be in heat transfer communication with the heat sink unit (410) and then in heat transfer communication with the heat exchanger (310).

The first fluid manifold (200) may comprise a first flow section (300) which extends from the flow inlet (210) to the flow outlet (212) and is provided in heat transfer communication with the heat exchanger (310).

The first fluid manifold (200) may comprise a second flow section (400) which extends from: a first flow port (500), provided on the first flow section (300) between the flow inlet (210) and the heat exchanger (310), to a second flow port (502), provided on the first flow section (300) between the heat exchanger (310) and the flow outlet (212). The second flow section (400) may be in heat transfer communication with a heat sink unit (410). In the first mode of operation, heat transfer fluid may be controlled to flow through the first flow port (500) into the first flow section (300) to be in heat transfer communication with the heat sink unit (410) and then flow through the second port (502). The heat transfer fluid may also be controlled to flow through the first flow port (500) into the second flow section (400) to be in heat transfer communication with the heat sink unit (410) and then flow through the second flow port (502).

The first fluid manifold (200) may comprise a third flow section (600) which extends from: a third flow port (504) provided on the second flow section (400) between the heat sink unit (410) and the second flow port (502); and a fourth flow port (506) provided on the first flow section (300) between the first flow port (500) and the heat exchanger (310). In the second mode of operation, the heat transfer fluid flow may be controlled such that all of the flow passes, in series, through the first flow port (500) to be in heat transfer communication with the heat sink unit (410), and then through the third flow port (504) and then the fourth flow port (506) to be in heat transfer communication with the heat exchanger (310).

The first fluid manifold (200) may comprise a fourth flow section (700) which extends from: a fifth flow port (508), provided on the first flow section (300) between the flow inlet (210) and the first flow port (500), to a sixth flow port (510), provided on the first flow section (300) between the second flow port (502) and the flow outlet (212). In the first mode of operation, all of the heat transfer fluid flow may exit through the flow outlet (212). In the second mode of operation, part of the heat transfer fluid flow may exit through the flow outlet (212) and the remainder of the heat transfer fluid flow is controlled to flow along the fourth flow section (700) from the sixth flow port (510) to the fifth flow port (508).

A fluid pump (230) may be provided in between the fifth flow port (508) and flow inlet (210).

A second flow control valve (802) may be provided in the first flow section (300) between the first flow port (500) and heat exchanger (310).

A third flow control valve (804) may be provided in the third flow section (600) between the third flow port (504) and fourth flow port (506).

A fourth flow control valve (806) may be provided in the second flow section (400) between the third flow port (504) and second flow port (502).

A fifth flow control valve (808) may be provided in the fourth flow section (700) between the fifth flow port (508) and sixth flow port (510).

A sixth flow control valve (810) may be provided in the first flow section (300) between the sixth flow port (510) and flow outlet (212).

In the first mode of operation:
the second flow control valve (802) may be controlled to be open;
the third flow control valve (804) may be controlled to be closed;
the fourth flow control valve (806) may be controlled to be open;
the fifth flow control valve (808) may be controlled to be closed;
the sixth flow control valve (810) may be controlled to be open.

In the second mode of operation:
the second flow control valve (802) may be controlled to be closed;
the third flow control valve (804) may be controlled to be open;
the fourth flow control valve (806) may be controlled to be closed;
the fifth flow control valve (808) may be controlled to be open; and
the sixth flow control valve (810) may be controlled to be open.

In the first mode of operation the second flow control valve (802) may be configured so that the percentage of fluid flow through the first flow section 300 and second flow section 400 is controlled to be a predetermined amount.

In the first mode of operation the second flow control valve (802) may be controllable to alter the percentage of fluid flow through the first flow section 300 and second flow section 400.

In the second mode of operation the fifth flow control valve (808) and/or sixth flow control valve (810) may be configured so that the percentage of fluid flow through each is controlled to be a predetermined amount.

In the second mode of operation the fifth flow control valve (808) and/or sixth flow control valve (810) may be controllable to alter the percentage of fluid flow therethrough.

The heat exchanger (310) may be an evaporator (908).

The evaporator (908) may be in heat transfer communication with a second fluid manifold (910) wherein the second fluid manifold (910) is fluidly isolated from the first fluid manifold (200). The second fluid manifold (910) may define a closed flow circuit in which there is provided, in series in the direction of working fluid flow around the second fluid manifold (910), the evaporator (908), a compressor (904), a condenser (902) and an expander (906) to provide a vapour cycle system.

The heat sink unit (410) may be a phase change material heat exchanger (412).

There may also be provided a system (2000) comprising: a cooling system (100) according to the present disclosure; a heat source (1000) and a heat source (1000) fluid cooling circuit (1100) in heat transfer communication with a heat transfer fluid. The heat source (1000) fluid cooling circuit (1100) may deliver the heat transfer fluid to the flow inlet (210) of the first fluid manifold (200) and receive heat transfer fluid from the flow outlet (212) of the first fluid manifold (200).

Hence there is provided a system which provides enhanced cooling capability compared to examples of the related art. The functionality to control the flow of heat transfer fluid through the heat sink and heat exchanger, either in parallel or in series, provides a cooling system which can alter the effective heat transfer capability of the system as a whole. This enables either smaller heat sinks and heat exchangers to be used and/or for denser power cycles of the 25 equipment which forms the heat source. Additionally, the cooling system of the present disclosure may be more responsive than examples of the related art.

BRIEF DESCRIPTION OF THE FIGURES

Embodiments of the invention will now be described by way of example only with reference to the figures, in which.

DETAILED DESCRIPTION

The present disclosure relates to a cooling system 100 for removing heat from a heat source 1000 fluid cooling circuit 1100. The present disclosure also relates to an apparatus, or a system 2000, comprising a heat source 1000 and a cooling system 100.

Figure 1:
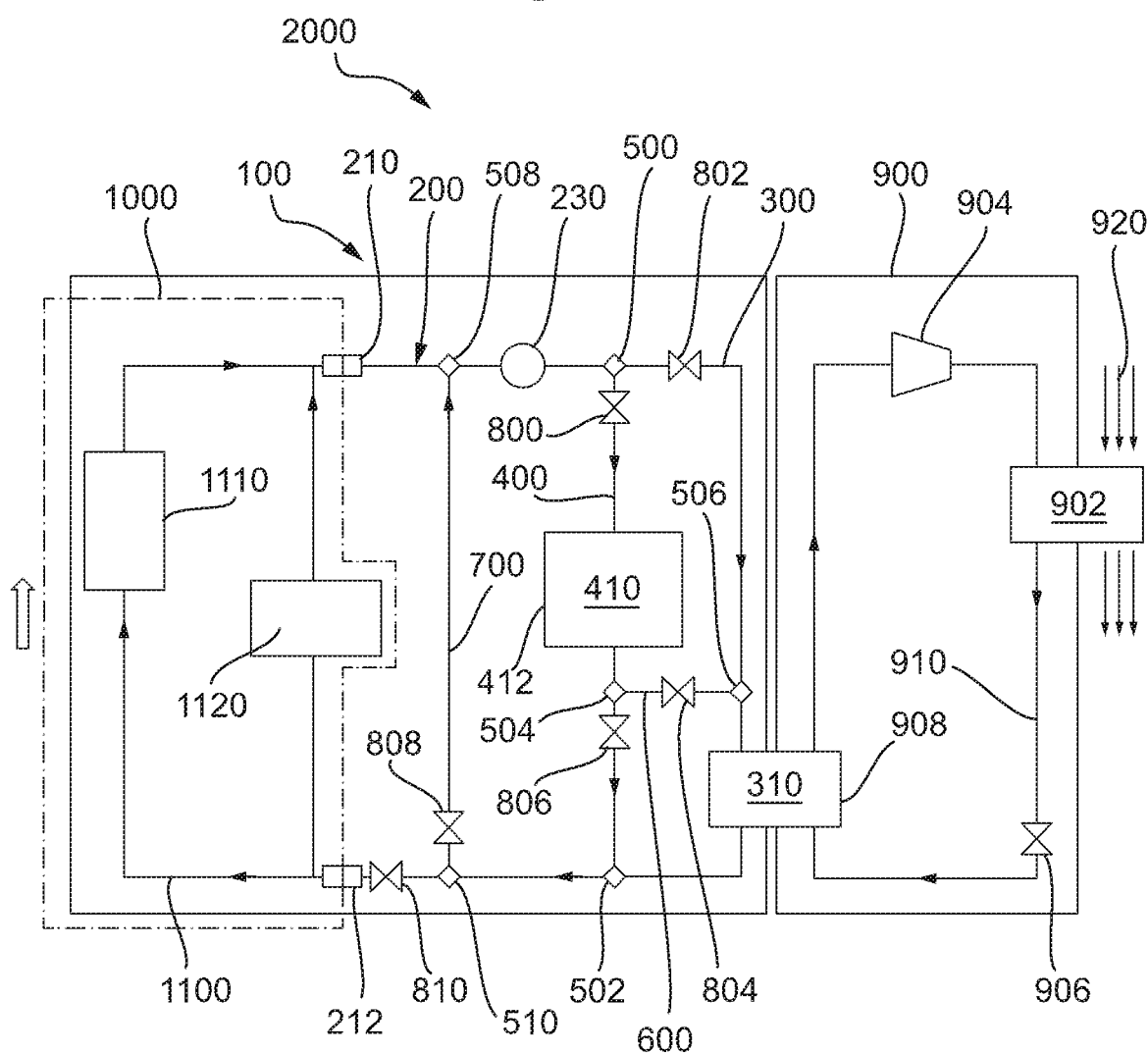
FIG. 1 shows a schematic representation of the cooling system according to the present disclosure in combination with a heat source.

As shown in FIG. 1, the heat source 1000 is provided with a fluid cooling circuit 1100 in heat transfer communication with a heat transfer fluid contained therein. That is to say, the heat source 1000 is provided (e.g. in heat transfer communication) with a fluid cooling circuit 1100 through which is contained, and through which may flow, a heat transfer fluid.

As shown in FIG. 1, the heat source 1000 (surrounded by a dotted line) may comprise a first heat generating unit 1110 and a second heat generating unit 1120, which each deliver heat to the fluid cooling circuit 1100. In the example shown the first heat generating unit 1110 and second heat generating unit 1120 are provided in parallel in the fluid cooling circuit 1100. In other examples they may be provided in series. In further examples there may be provided only a single piece of equipment which generates heat. The first heat generating unit 1110 and second heat generating unit 1120 may be the same or different types of equipment. Although the cooling system may be used with any heat source, it is configured with high power density applications in mind, for example high performance engines, machinery, electrical motors, communication equipment, medical/scientific scanning/sensing equipment, computing systems and/or other electrical or electronic equipment.

The heat source fluid cooling circuit 1100 delivers the heat transfer fluid to the cooling system 100 and, after the heat transfer fluid has been cooled, receives the heat transfer fluid from the cooling system 100 so the heat transfer fluid may extract further heat from the heat source. Thus the cooling system 100 is operable to remove heat from the heat source 1000 fluid cooling circuit 1100.

As shown in FIG. 1, the cooling system 100 comprises a first fluid manifold 200 for flow of a heat transfer fluid.

Hence the first fluid manifold 200 is configured to direct the flow of heat transfer fluid received from the heat source fluid cooling circuit 1100.

The first fluid manifold 200 comprises a flow inlet 210 for receiving heat transfer fluid from the heat source fluid cooling circuit 1100 and a flow outlet 212 for delivering fluid to the heat source fluid cooling circuit 1100. The flow inlet 210 and flow outlet 212 may be provided as fluid couplings. In other examples the flow inlet 210 and flow outlet 212 may simply be a transition region between the heat source 1000 and cooling system 1000. In a further example, the first fluid manifold 200 and heat source fluid cooling circuit 1100 may be provided as different regions of a single system.

As shown in FIG. 1, the cooling system 100 comprises a heat exchanger 310 and a heat sink unit 410. During operation of the cooling system, both the heat exchanger 310 and the heat sink unit 410 are in heat transfer communication with the first fluid manifold 200 such that heat transfer fluid in the first fluid manifold 200 is in heat transfer communication with the heat exchanger 310 and heat sink unit 410. For example, the pipework of the first fluid manifold 200 may pass through and/or around each of the heat exchanger 310 and/or heat sink unit 410. Additionally or alternatively, the first fluid manifold 200 may be in heat transfer communication with the heat exchanger 310 via a heat exchanger. Additionally or alternatively, the first fluid manifold 200 may be in heat transfer communication with the heat sink unit 410 via a heat exchanger.

The heat sink unit 410 may be provided as a phase change material heat exchanger 412. By way of non-limiting example, the phase change material may be chosen from a list comprising hydrated salt, organic materials, metallic phase change material, eutectic solutions or alcohol based solutions.

The heat exchanger 310 may be provided as an evaporator 908. For example the evaporator 908 may be provided as part of apparatus configured to operate to remove heat from the heat transfer fluid, for example a Vapour Cycle system or a reverse Brayton Cycle system. Such systems may be chosen because of their effectiveness of transferring heat energy from a source, such as the heat exchanger 310.

FIG. 1 illustrates an example in which the cooling system comprises a vapour cycle system. Hence in the example of FIG. 1, the evaporator 908 is in heat transfer communication with a second fluid manifold 910. The second fluid manifold 910 is provided with (i.e. contains) a working fluid. That is to say, a working fluid is contained in, and flows around, the second fluid manifold 910. The second fluid manifold 910 is fluidly isolated from the first fluid manifold 200. That is to say, there is no fluid transfer between the first fluid manifold 200 and the second fluid manifold 910.

In the example shown in FIG. 1, the second fluid manifold 910 defines a closed flow circuit in which there is provided, in series in the direction of working fluid flow around the second fluid manifold 910, the evaporator 908, a compressor 904, a condenser 902 an expander 906. This arrangement is operable as a vapour cycle system for the transfer of heat energy away from first fluid manifold 200 via the heat exchanger 310/evaporator 908.

In some examples the heat exchanger 310 and evaporator 908 may be the same piece of equipment. In other examples the heat exchanger 310 may be in heat transfer communication with the evaporator 908. In either case, functionally both examples operate in the same way, namely to transfer heat from the heat transfer fluid in the first fluid manifold 200 to the working fluid in the second fluid manifold 910. Hence in the present disclosure, the terms heat exchanger 310 and evaporator 908 are interchangeable with respect to examples in which the cooling system comprises an evaporator 908.

The condenser 902 may be in heat transfer communication with a heat sink, for example a reservoir of air or water. For example, the air may be ambient air or ambient which surrounds the system (illustrated by arrows 920 in FIG. 1). The expander 906 may be provided as an expansion flow control valve.

The details of the operation of the vapour cycle system are well known in the art and hence are not described in detail.

By way of example, a phase change material heat exchanger may have 300% to 400% more heat capacity than a vapour cycle system.

The heat transfer fluid in the first fluid manifold 200 may be the same as, or different to the working fluid in the second fluid manifold 910.

By way of non-limiting example, the heat transfer fluid may be chosen from a list comprising water/ethylene glycol, water/propylene glycol, water or heat transfer oils.

By way of non-limiting example, the working fluid may be a refrigerant.

The first fluid manifold 200 comprises a first flow section 300 which extends from the flow inlet 210 to the flow outlet 212 and is provided in heat transfer communication with the heat exchanger 310 (for example, evaporator 908) such that heat energy stored in the heat transfer fluid flowing through the first flow section 300 is transferred to the heat exchanger 310.

The first fluid manifold 200 comprises a second flow section 400. The second flow section 400 extends from a first flow port 500, provided on the first flow section 300 in the flow path between the flow inlet 210 and the heat exchanger 310, to a second flow port 502, provided on the first flow section 300 in the flow path between the heat exchanger 310 and the flow outlet 212. Hence the second flow section 400 defines a flow path that is operable to bypass the heat exchanger 310.

Additionally, the second flow section 400 is in heat transfer communication with the heat sink unit 410 such that heat energy stored in the heat transfer fluid flowing through the second flow section 400 is transferred to the heat sink unit 410.

The first fluid manifold 200 comprises a third flow section 600. The third flow section 600 extends from a third flow port 504 provided on the second flow section 400 in the flow path between the heat sink unit 410 and the second flow port 502 to a fourth flow port 506 provided on the first flow section 300 in the flow path between the first flow port 500 and the heat exchanger 310. That is to say, in some examples, the third flow section 600 extends from a third flow port 504 provided on the second flow section 400 in the flow path between a fluid outlet from the heat sink unit 410 and the second flow port 502 to a fourth flow port 506 provided on the first flow section 300 in the flow path between the first flow port 500 and an inlet to the heat exchanger 310.

The cooling system 100 is configured (i.e. operable) such that in a first mode of operation, heat transfer fluid is controlled to flow through the first flow section 300 and the second flow section 400 such that heat transfer fluid flow is in heat transfer communication with (e.g. passed through) the heat exchanger 310 and heat sink unit 410. Hence in the first mode of operation, and as will be described with reference to FIG. 2, the system is configured such that heat transfer fluid enters the flow inlet 210 and part of the heat transfer fluid flow is controlled to be in heat transfer communication with the heat exchanger 310, and the remainder of the heat transfer fluid flow is controlled to be in heat transfer communication with the heat sink unit 410.

Put another way, in the first mode of operation, the system is configured (i.e. operable) such that heat transfer fluid enters the flow inlet 210 and X % of the heat transfer fluid flow is controlled to pass along second flow section 400 to be in heat transfer communication with the heat exchanger 310, and (100–X) % of the heat transfer fluid flow is controlled to pass along the first flow section 300 to be in heat transfer communication with the heat sink unit 410. The two flows are combined after the heat transfer step is complete. X may be in the range of 50 to 90. X may be in the range of 60 to 80. X may have a value of about 70.

Figure 3:
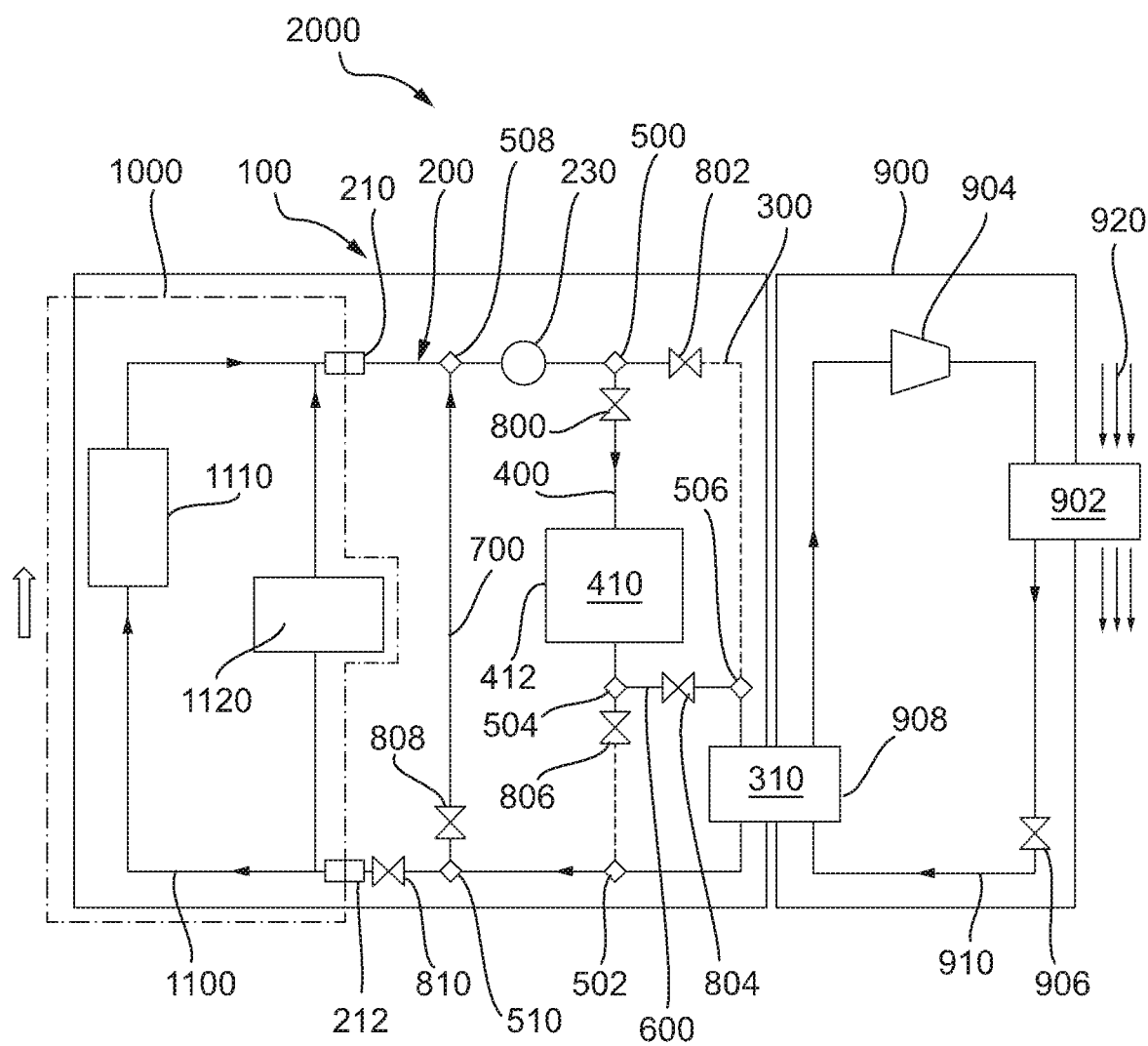
FIG. 3 shows the cooling system of the present disclosure in a second mode of operation.

In a second mode of operation, as shown in FIG. 3, heat transfer fluid enters the flow inlet 210 and all of the heat transfer fluid flow is controlled to first be in heat transfer communication with the heat sink unit 410 and then in heat transfer communication with the heat exchanger 310.

Put another way, in the second mode of operation, the system is configured (i.e. operable) such that heat transfer fluid enters the flow inlet 210 and 100% of the heat transfer fluid flow is controlled to pass along second flow section 400 to be in heat transfer communication with the heat sink unit 410, and then 100% of the heat transfer fluid flow is controlled to pass to the first flow section 300 to be in heat transfer communication with the heat exchanger 310.

That is to say, the cooling system 100 is configured (i.e. operable) such that in the second mode of operation, the heat transfer fluid flow is controlled such that all of the flow passes, in series, through the first flow port 500 to be in heat transfer communication with the heat sink unit 410, and then through the third flow port 504 and then the fourth flow port 506 to be in heat transfer communication with the heat exchanger 310 and then passing through the second flow port 502.

The first fluid manifold 200 comprises a fourth flow section 700 which extends from a fifth flow port 508, provided on the first flow section 300 in the flow path between the flow inlet 210 and the first flow port 500, to a sixth flow port 510, provided on the first flow section 300 in the flow path between the second flow port 502 and the flow outlet 212.

As shown in the figures, a fluid pump 230 may be provided in the first flow manifold 200 in the flow path between the fifth flow port 508 and flow inlet 210, operable to pump the heat transfer fluid around the first flow manifold 200 and fluid cooling circuit 1100 of the heat source 1000. Additionally or alternatively, a fluid pump 230 may be provided in the first flow manifold 200 in the flow path between the second flow port 502 and sixth flow port 510, operable to pump the heat transfer fluid around the first flow manifold 200 and fluid cooling circuit 1100 of the heat source 1000.

A first flow control valve 800 may be provided in the second flow section 400 in the flow path between the first flow port 500 and heat sink unit 410. This may be operable to allow for the isolation of the heat sink unit 410, for example during maintenance or repair, and/or to assist with the balance of flow through the second flow section 400.

A second flow control valve 802 may be provided in the first flow section 300 in the flow path between the first flow port 500 and heat exchanger 310. A third flow control valve 804 may be provided in the third flow section 600 in the flow path between the third flow port 504 and fourth flow port 506. A fourth flow control valve 806 may be provided in the second flow section 400 in the flow path between the third flow port 504 and second flow port 502. A fifth flow control valve 808 may be provided in the fourth flow section 700 in the flow path between the fifth flow port 508 and sixth flow port 510. A sixth flow control valve 810 may provided in the first flow section 300 in the flow path between the sixth flow port 510 and flow outlet 212. This may be operable to control the balance of flow through the fluid outlet 212 into the fluid cooling circuit 1100 of the heat source 1000 and the fourth flow section 700.

The cooling system 100 is configured (i.e. operable) such that in the first mode of operation:
  the first flow control valve 800 (in examples where present) is controlled (i.e. set) to be open;
  the second flow control valve 802 is controlled (i.e. set) to be open;
  the third flow control valve 804 is controlled (i.e. set) to be closed;
  the fourth flow control valve 806 is controlled (i.e. set) to be open;
  the fifth flow control valve 808 is controlled (i.e. set) to be closed;
  the sixth flow control valve 810 is controlled (i.e. set) to be open.

The cooling system 100 is configured (i.e. operable) such that in the in the second mode of operation:
  the first flow control valve 800 (in examples where present) is controlled (i.e. set) to be open;
  the second flow control valve 802 is controlled (i.e. set) to be closed;
  the third flow control valve 804 is controlled (i.e. set) to be open;
  the fourth flow control valve 806 is controlled (i.e. set) to be closed;
  the fifth flow control valve 808 is controlled (i.e. set) to be open; and
  the sixth flow control valve 810 is controlled (i.e. set) to be open.

In some examples, in the first mode of operation the first flow control valve 800 and/or second flow control valve 802 are configured so that the percentage of fluid flow through each is controlled (i.e. set) to be a predetermined amount. That is to say, the first flow control valve 800 and/or second flow control valve 802 are configured to control the percentage of heat transfer fluid flow along the second flow section 400 to be in heat transfer communication with the heat sink unit 410, and to control the percentage of heat transfer fluid flow along the first flow section 300 to be in heat transfer communication with the heat exchanger 310. In further examples, in the first mode of operation the first flow control valve 800 and/or second flow control valve 802 are controllable to alter the percentage of fluid flow therethrough. That is to say, the first flow control valve 800 and/or second flow control valve 802 are controllable to alter the percentage of fluid flow along the first flow section 300 to be in heat transfer communication with the heat exchanger 310, and along the second flow section 400 to be in heat transfer communication with the heat sink unit 410.

In further examples, in the second mode of operation the fifth flow control valve 808 and/or sixth flow control valve 810 are controllable (i.e. operable) to alter the percentage of fluid flow therethrough. Additionally or alternatively, in the second mode of operation the fifth flow control valve 808 and/or sixth flow control valve 810 are controllable (i.e. operable) to alter the percentage of fluid flow. Hence the relative flow through the heat source 1000 fluid cooling circuit 1100 and fourth flow section 700 may be controlled.

Put another way, in the second mode of operation, the fifth flow control valve 808 and/or sixth flow control valve 810 are operable such that of the heat transfer fluid that enters the sixth flow port 510, Z % of the heat transfer fluid flow is controlled to pass through the flow outlet 212 into the heat source 1000 fluid cooling circuit 1100, and (100−Z) % of the heat transfer fluid flow is controlled to pass along the fourth flow section 700 to bypass the heat source 1000 fluid cooling circuit 1100. Z may be in the range of 20 to 60. Z may be in the range of 30 to 50. Z may have a value of about 40.

There may be provided a control system (not shown) operable to control the opening, closing and adjustment of the valves. The control system may also be operable to control the other elements of the systems herein described.

Hence the cooling system 100 is configured (i.e. operable) such that in the first mode of operation, all of the heat transfer fluid flow exits through the flow outlet 212 to enter the fluid cooling circuit 1100 of the heat source 1000. Hence in the first mode of operation there is provided maximum cooling for the heat sources 1110, 1120.

The cooling system 100 is configured (i.e. operable) such that in the second mode of operation, part of the heat transfer fluid flow exits through the flow outlet 212 and the remainder of the heat transfer fluid flow is controlled to flow along the fourth flow section 700 from the sixth flow port 510 to the fifth flow port 508. Hence in the second mode of operation the system is operable to provide cooling for the heat sources 1110, 1120, and to increase the rate at which heat is removed from the heat sink unit 410, thereby allowing the heat sink unit 410 to recharge more quickly than in examples of the related art.

Figure 2:
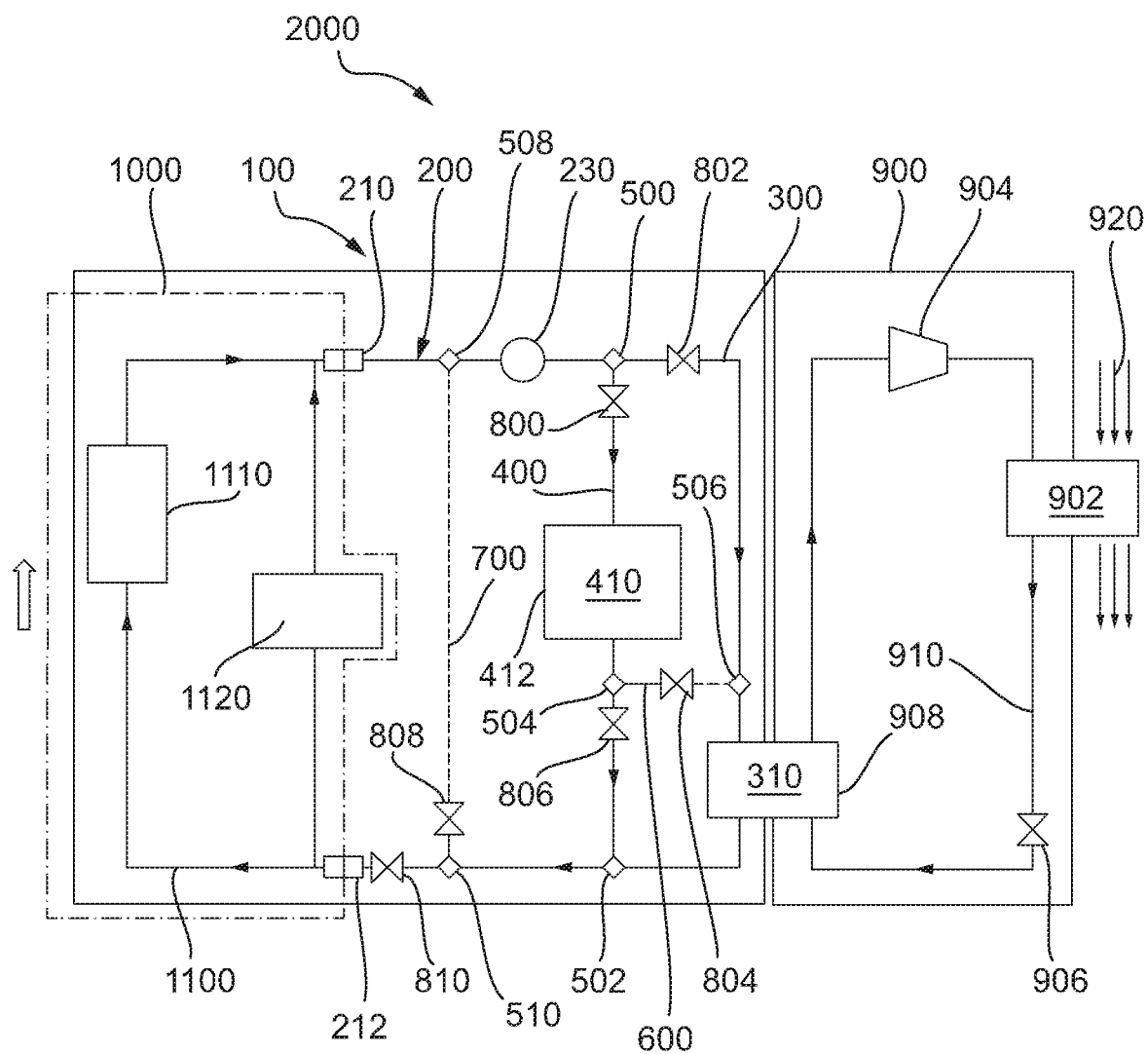
FIG. 2 shows the cooling system of the present disclosure in a first mode of operation.

The operation of the system of FIG. 1, and how the path of fluid is controlled, may be described with reference to FIG. 2 and FIG. 3. In FIG. 2 and FIG. 3 open flow paths are shown as a solid line, and the closed flow path are shown as a dashed line.

During operation, for example when the heat source equipment is operating to produce high levels of heat energy, the cooling system is controlled to operate in the first mode of operation. This is illustrated in FIG. 2. Hence:

the first flow control valve 800 (in examples where present) and fourth flow control valve 806 are open, and heat transfer fluid flows into the second flow section 400;

the second flow control valve 802 is open and heat transfer fluid flows into the first flow section 300;

the third flow control valve 804 is closed to prevent flow along the third flow section 600;

the fifth flow control valve 808 is closed to prevent flow along the fourth flow section 700;

the sixth flow control valve 810 is open and heat transfer fluid flows into the fluid cooling circuit 1100.

Thus heat transfer fluid enters the flow inlet 210 and part of the heat transfer fluid flow is controlled to be in heat transfer communication with the heat exchanger 310, and the remainder of the heat transfer fluid flow is controlled to be in heat transfer communication with the heat sink unit 410. The split flow is then recombined at flow port 502, passes though flow control valve 810, then the flow outlet 212 to enter the fluid cooling circuit 1100 of the heat source 1000. It will then travel around the fluid cooling circuit 1100 of the heat source 1000 and re-enter the first flow manifold 200 via the flow inlet 210.

When the heat source equipment does not need the extra cooling of the first mode of operation and/or when heat sink unit 410 has reached capacity, the cooling system is controlled to operate in the second mode of operation. This is illustrated in FIG. 3. Hence:

the first flow control valve 800 (in examples where present) is open and the second flow control valve 802 is controlled to be closed to direct all of the heat transfer fluid flow along the second fluid flow section 400 to be in heat transfer communication with the heat sink unit 410; and to prevent any of the heat transfer fluid flow from entering the first flow section 300 via the second control valve 802;

the fourth flow control valve 806 is closed and the third flow control valve 804 is open to direct all of the flow along the third flow section 600 to be in to be in heat transfer communication with the heat exchanger 310 (i.e. after first being in heat transfer communication with the heat sink unit 410);

the fifth flow control valve 808 and sixth flow control valve 810 are controlled to be open so that some of the heat transfer fluid flow passes though the flow control valve 810, then the flow outlet 212 to enter the fluid cooling circuit 1100 of the heat source 1000. It will then travel around the fluid cooling circuit 1100 of the heat source 1000 and re-enter the first flow manifold 200 via the flow inlet 210. The remainder of the heat transfer fluid flow will pass along the fourth flow section 700 and be combined with heat transfer fluid entering the first flow manifold 200 via the flow inlet 210.

Hence in the second mode of operation, as shown in FIG. 3, heat transfer fluid enters the flow inlet 210 and all of the heat transfer fluid flow is controlled to first be in heat transfer communication with the heat sink unit 410 and then in heat transfer communication with the heat exchanger 310, and only part of the total flow is passed around the fluid cooling circuit 1100 of the heat source 1000.

The fifth flow control valve 808 and sixth flow control valve 810 are controlled to split the flow as required (and as herein described) between the fluid cooling circuit 1100 of the heat source 1000 and the fourth flow section 700.

Hence in the second mode of operation cooling of the heat source 1000 is achieved at the same time as stored heat energy is removed from the heat sink unit 410 to prepare it for its next cooling cycle.

Hence there is provided a system which provides enhanced cooling capability compared to examples of the related art. The functionality to control the flow of heat transfer fluid through the heat sink and heat exchanger, either in parallel or in series, provides a cooling system which can alter the effective heat transfer capability of the system as a whole.

For example, when the heat sink 410 and heat exchanger 310 are controlled to operate (i.e. receive heat transfer fluid fluid) in parallel (for example in the first mode of operation, as shown in FIG. 2), then the cooling capability of the system is maximised. However, when the heat sink 410 and heat exchanger 310 are controlled to operate (i.e. receive heat transfer fluid fluid) in series (for example in the second mode of operation as shown in FIG. 3), then the system is providing cooling to the equipment providing a heat source as well as removing heat from the heat sink 410 to prepare it for when the next peak heat load occurs.

The configuration of the first flow manifold 200 and fluid cooling circuit 1100 of the heat source 1000 results in the need for only one fluid pump 230, since a pump in the defined location is able to move fluid around both the first flow manifold 200 and fluid cooling circuit 1100.

The operability of the apparatus of the present disclosure enables either smaller heat sinks and heat exchangers to be used and/or for the equipment acting as a heat source to operate with denser power cycles.

The configuration of the apparatus of the present disclosure may also result in a system which is inherently more responsive than examples of the related art since it combines two different types of cooling systems (i.e. the heat sink 410 and (for example) the vapour cycle system.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A cooling system for removing heat from a heat source fluid cooling circuit, the cooling system comprising:
   a first fluid manifold for flow of a heat transfer fluid, the first fluid manifold comprising a flow inlet and a flow outlet;
   a heat exchanger and a heat sink unit each in heat transfer communication with the first fluid manifold;
   wherein, in a first mode of operation, heat transfer fluid enters the flow inlet and part of the heat transfer fluid flow is controlled to be in heat transfer communication with the heat exchanger, and the remainder of the heat transfer fluid flow is controlled to be in heat transfer communication with the heat sink unit, after which the flows are combined before passing through the flow outlet; and
   in a second mode of operation, heat transfer fluid enters the flow inlet and all of the heat transfer fluid flow is controlled to first be in heat transfer communication with the heat sink unit and then in heat transfer communication with the heat exchanger.

2. The cooling system as claimed in claim 1, wherein the first fluid manifold comprises a first flow section which extends from the flow inlet to the flow outlet and is provided in heat transfer communication with the heat exchanger.

3. The cooling system as claimed in claim 2, wherein the first fluid manifold comprises a second flow section which extends from:
   a first flow port, provided on the first flow section between the flow inlet and the heat exchanger, to
   a second flow port, provided on the first flow section between the heat exchanger and the flow outlet; and
   the second flow section being in heat transfer communication with the heat sink unit,
   wherein, in the first mode of operation, heat transfer fluid is controlled to flow through the first flow port into the first flow section to be in heat transfer communication with the heat sink unit and then flow through the second port; and
   through the first flow port into the second flow section to be in heat transfer communication with the heat sink unit and then flow through the second flow port.

4. The cooling system as claimed in claim 2, wherein the first fluid manifold comprises a third flow section which extends from:
   a third flow port provided on a second flow section between the heat sink unit and a second flow port; and
   a fourth flow port provided on the first flow section between a first flow port and the heat exchanger;
   wherein in the second mode of operation, the heat transfer fluid flow is controlled such that all of the flow passes, in series, through the first flow port to be in heat transfer communication with the heat sink unit, and then through the third flow port and then the fourth flow port to be in heat transfer communication with the heat exchanger.

5. The cooling system as claimed in claim 3, wherein the first fluid manifold comprises a fourth flow section which extends from
   a fifth flow port, provided on the first flow section between the flow inlet and the first flow port, to
   a sixth flow port, provided on the first flow section between the second flow port and the flow outlet,
   wherein in the first mode of operation,
   all of the heat transfer fluid flow exits through the flow outlet,
   wherein in the second mode of operation,
   part of the heat transfer fluid flow exits through the flow outlet and the remainder of the heat transfer fluid flow is controlled to flow along the fourth flow section from the sixth flow port to the fifth flow port.

6. The cooling system as claimed in claim 5, wherein a fluid pump is provided in between the fifth flow port and the flow inlet.

7. The cooling system as claimed in claim 5, wherein:
   a second flow control valve is provided in the first flow section between the first flow port and heat exchanger;
   a third flow control valve is provided in the third flow section between the third flow port and fourth flow port;
   a fourth flow control valve is provided in the second flow section between the third flow port and second flow port;
   a fifth flow control valve is provided in the fourth flow section between the fifth flow port and sixth flow port; and
   a sixth flow control valve is provided in the first flow section between the sixth flow port and flow outlet; and
   in the first mode of operation:
   the second flow control valve is controlled to be open;
   the third flow control valve is controlled to be closed;
   the fourth flow control valve is controlled to be open;
   the fifth flow control valve is controlled to be closed;
   the sixth flow control valve is controlled to be open; and
   in the second mode of operation:
   the second flow control valve is controlled to be closed;
   the third flow control valve is controlled to be open;
   the fourth flow control valve is controlled to be closed;

the fifth flow control valve is controlled to be open; and
the sixth flow control valve is controlled to be open.

8. The cooling system as claimed in claim 7, wherein in the first mode of operation the second flow control valve is configured so that the percentage of fluid flow through the first flow section 300 and second flow section 400 is controlled to be a predetermined amount.

9. The cooling system as claimed in claim 7, wherein in the first mode of operation the second flow control valve is controllable to alter the percentage of fluid flow through the first flow section 300 and second flow section.

10. The cooling system as claimed in claim 7, wherein in the second mode of operation the fifth flow control valve and/or sixth flow control valve are configured so that the percentage of fluid flow through each is controlled to be a predetermined amount.

11. The cooling system as claimed in claim 7, wherein in the second mode of operation the fifth flow control valve and/or sixth flow control valve are controllable to alter the percentage of fluid flow therethrough.

12. The cooling system as claimed in claim 1, wherein the heat exchanger is an evaporator.

13. The cooling system as claimed in claim 12, wherein the evaporator is in heat transfer communication with a second fluid manifold wherein the second fluid manifold is fluidly isolated from the first fluid manifold,
wherein the second fluid manifold defines a closed flow circuit in which there is provided, in series in the direction of working fluid flow around the second fluid manifold, the evaporator, a compressor, a condenser and an expander to provide a vapour cycle system.

14. The cooling system as claimed in claim 1, wherein the heat sink unit is a phase change material heat exchanger.

15. A system comprising:
a cooling system according to claim 1;
a heat source and a heat source fluid cooling circuit in heat transfer communication with a heat transfer fluid,
wherein the heat source fluid cooling circuit delivers the heat transfer fluid to the flow inlet of the first fluid manifold and receives heat transfer fluid from the flow outlet of the first fluid manifold.

* * * * *